(12) United States Patent
Hames et al.

(10) Patent No.: US 10,157,872 B2
(45) Date of Patent: Dec. 18, 2018

(54) SEMICONDUCTOR DEVICE AND METHOD OF MANUFACTURING THEREOF

(71) Applicant: Amkor Technology, Inc., Tempe, AZ (US)

(72) Inventors: Greg Hames, Raleigh, NC (US); Glenn Rinne, Apex, NC (US); Devarajan Balaraman, Apex, NC (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 16/035,231

(22) Filed: Jul. 13, 2018

(65) Prior Publication Data
US 2018/0323161 A1 Nov. 8, 2018

Related U.S. Application Data

(63) Continuation of application No. 15/350,647, filed on Nov. 14, 2016, now Pat. No. 10,037,957.

(51) Int. Cl.
*H01L 21/44* (2006.01)
*H01L 23/00* (2006.01)

(52) U.S. Cl.
CPC .............. *H01L 24/11* (2013.01); *H01L 24/13* (2013.01); *H01L 2224/11462* (2013.01); *H01L 2224/11614* (2013.01); *H01L 2224/13026* (2013.01)

(58) Field of Classification Search
CPC ..................... H01L 24/11; H01L 24/13; H01L 2224/03912; H01L 2224/11462; H01L 2224/13026; H01L 2224/13099
USPC .................................................. 438/612–617
See application file for complete search history.

(56) References Cited

U.S. PATENT DOCUMENTS

2005/0215045 A1* 9/2005 Rinne ...................... H01L 24/11
438/614
2013/0196499 A1* 8/2013 Burgess .................. H01L 24/11
438/614

\* cited by examiner

*Primary Examiner* — Brook Kebede
(74) *Attorney, Agent, or Firm* — McAndrews, Held & Malloy, Ltd.

(57) ABSTRACT

A semiconductor device and a method of manufacturing a semiconductor device. As a non-limiting example, various aspects of this disclosure provide a method of manufacturing a semiconductor device comprising forming interconnection structures by at least part performing a lateral plating process, and a semiconductor device manufactured thereby.

20 Claims, 13 Drawing Sheets

SEMICONDUCTOR DEVICE AND METHOD OF MANUFACTURING THEREOF

CROSS-REFERENCE TO RELATED APPLICATIONS/INCORPORATION BY REFERENCE

This application is a continuation of U.S. patent application Ser. No. 15/350,647, filed Nov. 14, 2016, and titled SEMICONDUCTOR DEVICE AND METHOD OF MANUFACTURING THEREOF, the entire contents of which are hereby incorporated herein by reference, in their entirety.

BACKGROUND

Present semiconductor devices and methods for manufacturing semiconductor devices are inadequate, for example resulting in manufacturing processes that are too time-consuming and/or too costly, resulting in semiconductor packages with unreliable connections and/or interconnection structures having suboptimal dimensions, etc. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
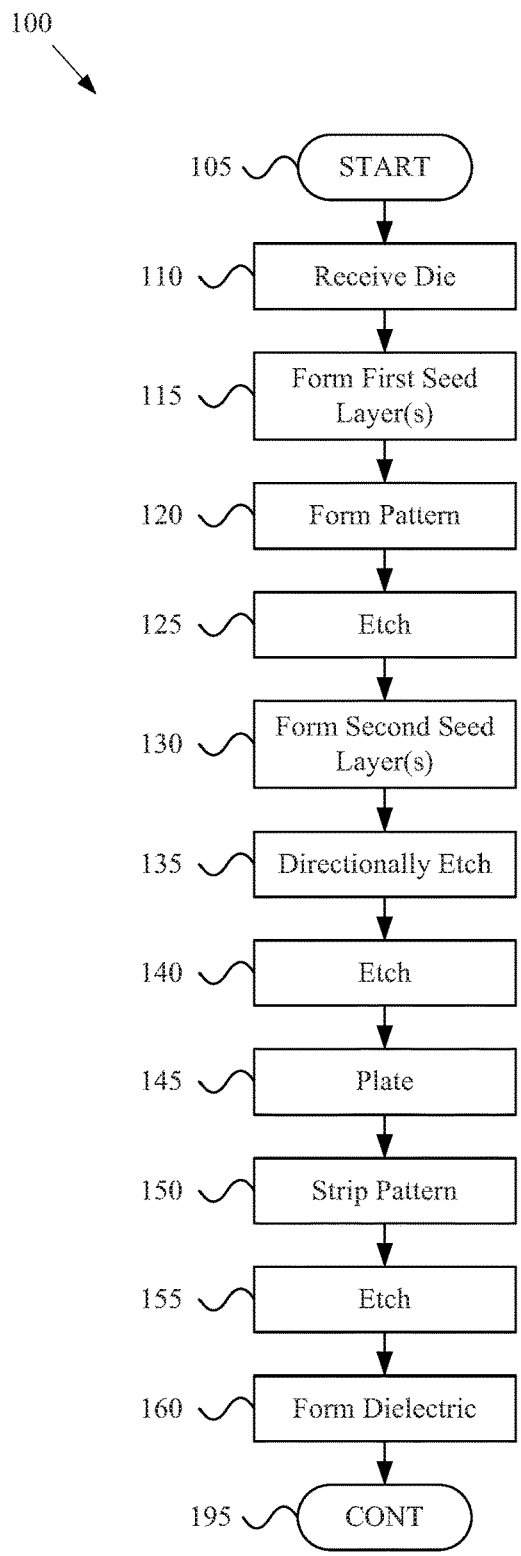
FIG. 1 shows a flow diagram of an example method of manufacturing a semiconductor device, in accordance with various aspects of the present disclosure.

Various aspects of this disclosure provide a semiconductor device and a method of manufacturing a semiconductor device. As a non-limiting example, various aspects of this disclosure provide a method of manufacturing a semiconductor device comprising forming interconnection structures by at least part performing a lateral plating process, and a semiconductor device manufactured thereby.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "above," "lower," "below," "side," "lateral," "horizontal," "vertical," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

It will also be understood that terms coupled, connected, attached, and the like include both direct and indirect (e.g., with an intervening element) coupling, connecting, attaching, etc., unless explicitly indicated otherwise. For example, if element A is coupled to element B, element A may be indirectly coupled to element B through an intermediate signal distribution structure, element A may be directly coupled to element B (e.g., adhered directly to, soldered directly to, attached by direct metal-to-metal bond, etc.), etc.

In the drawings, the dimensions of structures, layers, regions, etc. (e.g., absolute and/or relative dimensions) may be exaggerated for clarity. While such dimensions are generally indicative of an example implementation, they are not limiting. For example, if structure A is illustrated as being larger than region B, this is generally indicative of an example implementation, but structure A is generally not required to be larger than structure B, unless otherwise indicated. Additionally, in the drawings, like reference numerals may refer to like elements throughout the discussion.

Various aspects of the present disclosure provide a method of manufacturing a semiconductor device (or other electronic device), and a semiconductor device (or other electronic device) manufactured thereby. As explained herein, the scope of this disclosure is not limited to semiconductor devices. For example, the scope of this disclosure includes any of a variety of electronic components (e.g., semiconductor dies, digital or analog devices, interposers or substrates or thin film substrates, MEMS devices, active or passive electronic components, etc.).

In an example implementation, various aspects of the present disclosure provide a method of manufacturing an electronic device, and an electronic device manufactured thereby, wherein the method comprises: receiving a semiconductor die (or other electronic component) comprising a top die side and a bond pad on the top die side; forming a first one or more seed layers on the top die side, the first one or more seed layers being electrically connected to the bond pad; forming a pattern on the first one or more seed layers, the pattern comprising a top pattern surface and an interior pattern surface; forming a second one or more seed layers on at least the interior pattern surface; and plating a metal pillar in at least a lateral direction from at least the second one or more seed layers.

In an example implementation, various aspects of the present disclosure provide a method of manufacturing an electronic device, and an electronic device manufactured thereby, wherein the method comprises: receiving a semiconductor die comprising a top die side; forming a pattern on the top die side, the pattern comprising a horizontal pattern surface and a vertical pattern surface; and plating a metal pillar in at least a lateral direction from at least the second one or more seed layers, wherein after said plating is completed the plated metal pillar comprises an interior cavity.

In an example implementation, various aspects of the present disclosure provide a method of manufacturing an electronic device, and an electronic device manufactured thereby, wherein the method comprises: receiving a semiconductor die comprising a top die side; forming a pattern on the top die side, the pattern comprising an upward-facing pattern surface and a laterally-facing pattern surface; forming one or more seed layers on at least the laterally-facing pattern surface; and plating a metal pillar on the one or more seed layers, wherein the metal pillar has a width dimension, and a height dimension that is greater than the width dimension.

Various aspects of the present disclosure will now be described in detail with reference to the accompanying drawings such that they may be readily practiced by those skilled in the art.

FIG. 1 shows a flow diagram of an example method 100 of manufacturing a semiconductor device, in accordance with various aspects of the present disclosure. FIGS. 2A-2L show cross-sectional views of an example semiconductor device during manufacturing in accordance with the example method of FIG. 1. The following discussion will generally refer to FIG. 1 and FIGS. 2A-2L together.

The example method 100 may begin executing at block 105. The example method 100 may begin executing in response to any of a variety of conditions, non-limiting examples of which are provided herein. For example, the example method 100 may begin execution by receiving execution flow from any of the blocks 110-195 of the example method 100 or any portion of such blocks 110-195. Also for example, the example method 100 may begin execution by receiving execution flow from any of the blocks 310-395 of the example method 300 of FIG. 3 or any portion of such blocks 310-395.

The example method 100 may, at block 110, comprise receiving a semiconductor die (or a wafer or panel thereof). Block 110 may comprise receiving the semiconductor die (or wafer or panel thereof) in any of a variety of manners, non-limiting examples of which are provided herein.

Block 110 may, for example, comprise receiving a single semiconductor die (or electronic component). Also for example, block 110 may comprise receiving the semiconductor die as part of a wafer or panel of semiconductor dies. Block 110 may, for example, comprise receiving the semiconductor die from an upstream manufacturing station, from a testing station, from a shipping receiving station, from a cleaning station, etc.

The received semiconductor die (or other electronic component) may comprise any of a variety of characteristics. Such semiconductor die may, for example, comprise a processor die, microprocessor, microcontroller, co-processor, general purpose processor, application-specific integrated circuit, programmable and/or discrete logic device, memory device, combination thereof, equivalent thereof, etc.

Note that although the examples provided herein generally concern a semiconductor die as an example semiconductor component, the scope of the present disclosure is not limited thereto. For example, the scope of various aspects of this disclosure includes any of a variety of electronic components (e.g., semiconductor dies, digital and/or analog devices, interposers, substrates or thin film substrates, active or passive components, MEMS devices, etc.). For example block 110 may also, for example, comprise receiving one or more passive electronic devices (e.g., resistors, capacitors, inductors, etc.). Any or all of the operations discussed herein may be performed on one or more semiconductor die, on one or more passive electronic devices, on an interposer or substrate, MEMS devices, any combination thereof, etc.

Figure 2A:
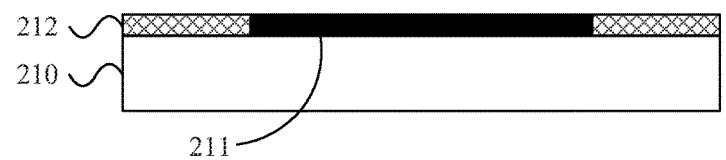
FIGS. 2A-2L show cross-sectional views of an example semiconductor device during manufacturing in accordance with the example method of FIG. 1.

A non-limiting example of the die receiving of block 110 is shown at FIG. 2A. The example semiconductor die 200A comprises a substrate 210 (e.g., a semiconductor substrate with electronic devices formed therein, etc.). The example semiconductor die 200A also comprises a bond pad 211 (e.g., through which electrical connection is provided to active circuitry of the die 200A). The bond pad 211 may comprise any of a variety of metals (e.g., copper, aluminum, gold, silver, etc.).

The example semiconductor die 200A also comprises a passivation (or dielectric) layer 212. The passivation layer 212 may, for example, cover the active circuitry of the semiconductor die 200A and provide electrical isolation between adjacent bond pads. Though the example passivation layer 212 is shown having a top surface that is generally coplanar with the top surface of the bond pad 211, the scope of this disclosure is not limited thereto. For example, the passivation layer 212 may cover a top periphery of the bond pad 211.

Note that although the present disclosure generally provides examples including a single bond pad and corresponding interconnection structure, the scope of the present disclosure is not limited thereto. For example, the semiconductor die may comprise any number of bond pads and interconnection structures. For example, any or all of the example illustrations shown and discussed herein may be laterally replicated in one or two dimensions to form an array or matrix or bond pads and interconnection structures.

Additionally, although the present disclosure generally provides examples including forming interconnection structures on semiconductor die bond pads, such structures may be formed on distribution layer traces, fan-in and/or fan-out traces, through-silicon vias, through mold vias, etc. Such forming of interconnection structures may thus, for example, be formed on an active side of a semiconductor die and/or on an inactive side of a semiconductor die.

In general, block 110 may comprise receiving a semiconductor die (or electronic component). Accordingly, the scope of the present disclosure should not be limited by characteristics of any particular manner of receiving a semiconductor die (or electronic component) or of any particular type of semiconductor die (or electronic component).

The example method 100 may, at block 115, comprise forming a first set of one or more seed layers on the semiconductor die (or wafer thereof). Block 115 may comprise forming the first set of one or more seed layers in any of a variety of manners, non-limiting examples of which are provided herein.

The first set of one or more seed layers may comprise any of a variety of materials. For example, the first set of one or more seed layers may comprise a first layer of titanium-tungsten (TiW), a second layer of copper (Cu), and a third layer of titanium-tungsten (TiW). Also for example, the first set of one or more seed layers may comprise one or more layers of any of a variety of metals (e.g., silver, gold, copper, aluminum, tungsten, titanium, nickel, molybdenum, etc.) or alloys thereof. Note that other materials (e.g., Parylene, etc.) may also be utilized.

Block 115 may comprise forming the first set of one or more seed layers utilizing any of a variety of techniques (e.g., sputtering or other physical vapor deposition (PVD) technique, chemical vapor deposition (CVD), atomic layer deposition (ALD), plasma vapor deposition, electroless plating, electrolytic plating, etc.). Block 115 may comprise forming each of the first set of one or more seed layers using a same process or utilizing different respective types of processes. The first set of one or more seed layers (or any portion thereof) may, for example, be utilized during a subsequent electroplating process (e.g., at block 145, etc.).

Figure 2B:
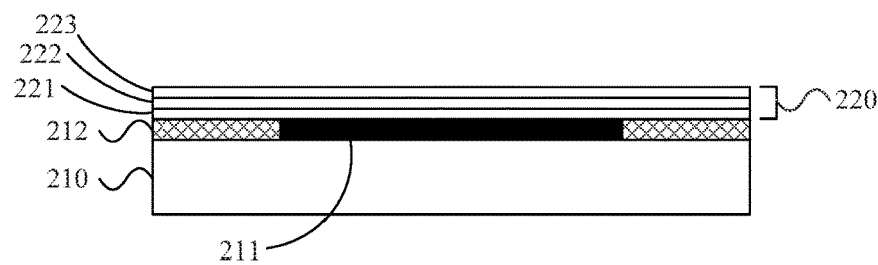

A non-limiting example 200B of the seed layer forming of block 115 is shown at FIG. 2B. In the example 200B, a first seed layer 221 (e.g., TiW or any of the metals discussed herein) is formed on the semiconductor die 200A (e.g., directly on the bond pad 211 and on the passivation layer 212). Then a second seed layer 222 (e.g., Cu or any of the metals discussed herein) is formed on (e.g., directly on, etc.) the first seed layer 221. Then a third seed layer 223 (e.g., TiW or any of the metals discussed herein) is formed on (e.g., directly on, etc.) the second seed layer 222. Though the first set of seed layers 220 is shown in the example 200B comprising three layers, any integer number of layers may be formed. In another example implementation, the third seed layer 223 may be omitted.

In the example 200B, each of the TiW seed layers 221 and 223 may, for example, be formed to a thickness of 1000 Angstroms, and the Cu seed layer 222 may, for example, be formed to a thickness of 2000 Angstroms, but the scope of this disclosure is not limited to such example respective thicknesses.

In general, block 115 may comprise forming a first set of one or more seed layers. Accordingly, the scope of the present disclosure should not be limited by characteristics of any particular manner of forming such seed layer(s) or by characteristics of any particular type of seed layer.

The example method 100 may, at block 120, comprise forming a pattern (or template or mask) on the first set of one or more seed layers formed at block 115. Block 120 may comprise forming the pattern in any of a variety of manners, non-limiting examples of which are provided herein.

For example, block 120 may comprise forming a pattern (or template or mask) over the first set of one or more seed layers to define a region (or volume) in which a metal pillar (or other interconnection structure) is to be formed. For example, the pattern may comprise a photoresist (PR) material, photopolymer material, general dielectric material, etc. The pattern may, for example, be patterned to cover regions other than a region on which the metal pillar (or other interconnection structure) is to be formed. The pattern may, for example, be formed of a material that is readily removable at a later stage (e.g., at block 150, etc.).

Figure 2C:
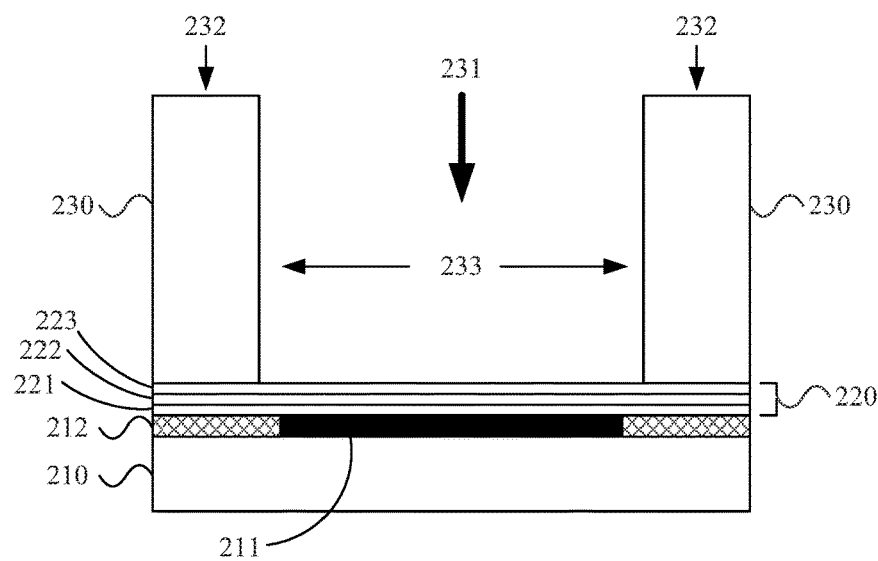

A non-limiting example 200C of the pattern forming of block 120 is shown at FIG. 2C. In the example 200C, a photoresist (PR) 230 is patterned to include an aperture 231 (or opening) in which a metal pillar is to be formed (e.g., plated at block 145, etc.). The aperture 231 may, for example, be bounded by one or more interior pattern surface(s) 233. The interior pattern surface(s) 233 may, for example, face generally laterally (or horizontally). The interior pattern surface(s) 233 may, for example, be vertical, within 5% or 10% of vertical, etc.

The example photoresist 230 may also, for example, comprise a top pattern surface 232. The top pattern surface 232 may, for example, be generally planar and may, for example, be generally parallel to the top of the semiconductor die 200A and/or to the first set of one or more seed layers 220 (e.g., exactly parallel, within 5% or 10% of parallel, etc.).

The aperture 231 may, for example, comprise a cylindrical volume, cubical volume, etc. Note, however, that the aperture 231 may comprise any of a variety of different shapes. Block 120 may, for example, comprise forming the PR 230 using a positive or negative photo process.

In general, block 120 may comprise forming a pattern. Accordingly, the scope of the present disclosure should not be limited by characteristics of any particular manner of forming such pattern or by characteristics of any particular type of pattern.

The example method 100 may, at block 125, comprise etching, for example etching at least one of the first set of one or more seed layers formed at block 115. Block 125 may comprise performing such etching in any of a variety of manners, non-limiting examples of which are provided herein.

Block 125 may, for example, comprise performing a wet etching process to remove at least one of the first set of one or more seed layers. Block 125 may also, for example, comprise performing other types of etching (e.g., plasma etching or dry etching, anisotropic etching, etc.).

Figure 2D:
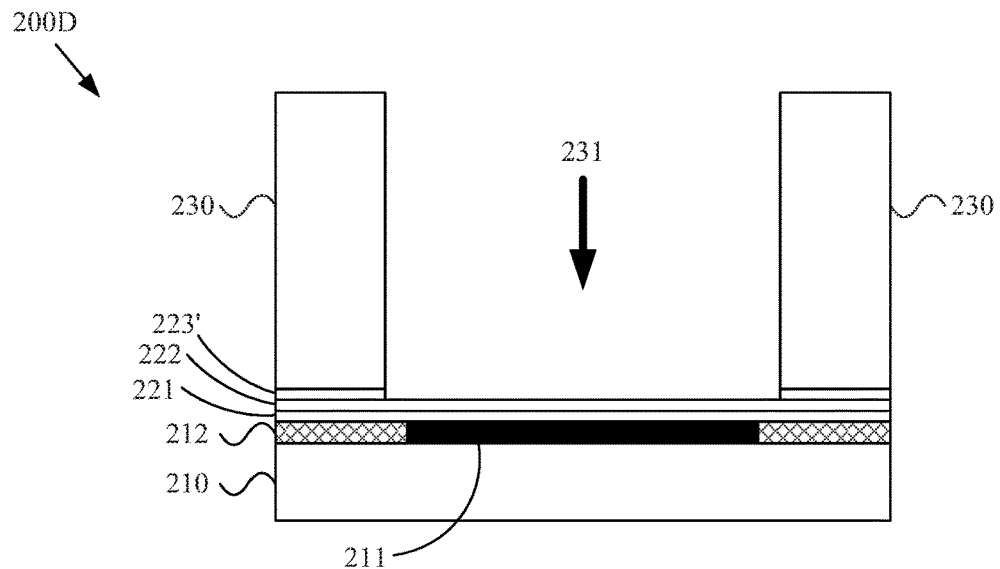

A non-limiting example 200D of the etching of block 125 is shown at FIG. 2D. For example, a portion of the third seed layer 223 (e.g., a TiW layer) that is exposed by the pattern 230 is etched away, leaving a remaining portion of the third seed layer 223' that is covered by the pattern 230. Note that a layer may also be thinned by the etching rather than completely removed.

In an alternative embodiment in which there are no layers of the first set of one or more seed layers to etch, block 125 may be skipped.

In general, block 125 may comprise etching. Accordingly, the scope of the present disclosure should not be limited by characteristics of any particular manner of performing such etching or by characteristics of any particular type of etching.

The example method 100 may, at block 130, comprise forming a second set of one or more seed layers. Block 130 may comprise forming the second set of one or more seed layers in any of a variety of manners, non-limiting examples of which are provided herein.

The second set of one or more seed layers may comprise any of a variety of materials. For example, the second set of one or more seed layers may comprise a first layer of titanium-tungsten (TiW), a second layer of copper (Cu), and a third layer of titanium (Ti) and/or parylene. Also for example, the second set of one or more seed layers may comprise one or more layers of any of a variety of metals (e.g., silver, gold, copper, aluminum, tungsten, titanium, nickel, molybdenum, etc.) or alloys thereof. Note that other materials (e.g., Parylene, etc.) may also be used.

Block 130 may comprise forming the second set of one or more seed layers utilizing any of a variety of techniques (e.g., sputtering or other physical vapor deposition (PVD) technique, chemical vapor deposition (CVD), atomic layer deposition (ALD), plasma vapor deposition, electroless plating, electrolytic plating, etc.). Block 130 may comprise forming each of the second set of one or more seed layers using a same process or utilizing different respective types of processes. The second set of one or more seed layers (or any portion thereof) may, for example, be utilized during a subsequent electroplating process (e.g., at block 145, etc.).

Figure 2E:
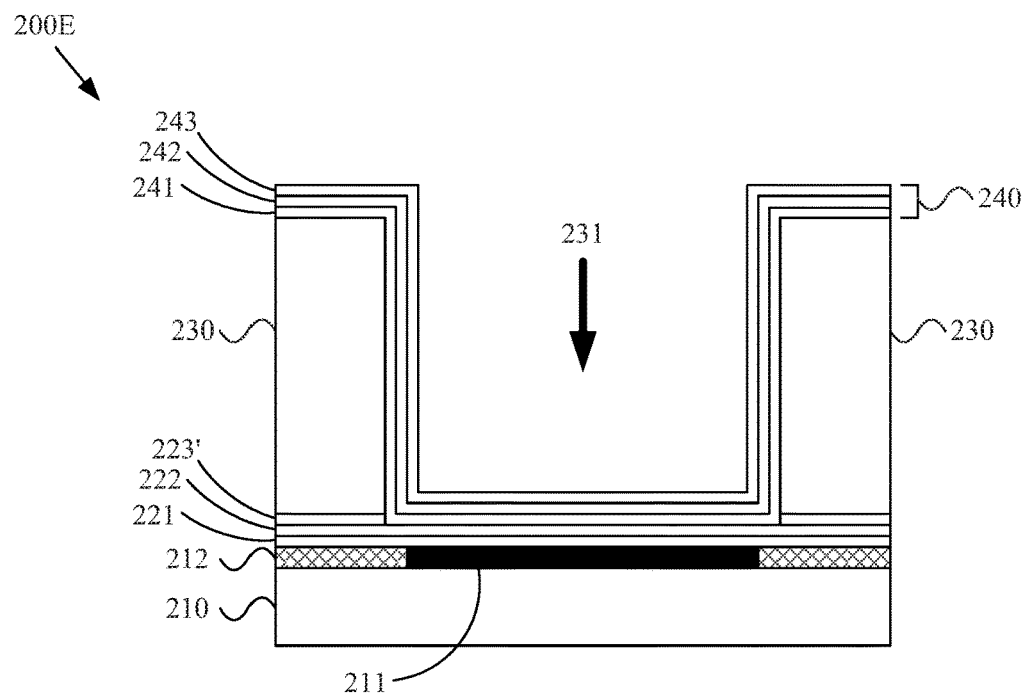

A non-limiting example 200E of the seed layer forming of block 130 is shown at FIG. 2E. In the example 200E, a fourth seed layer 241 (e.g., TiW or any of the metals discussed herein) is formed on the semiconductor die 200A (e.g., directly on the second seed layer 222 and on interior pattern surface(s) 233 and top pattern surface 232 of the pattern 230). Then a fifth seed layer 242 (e.g., Cu or any of the metals discussed herein) is formed on (e.g., directly on, etc.) the fourth seed layer 241. Then a sixth seed layer 243 (e.g., Ti or Parylene or any of the metals or materials discussed herein) is formed on (e.g., directly on, etc.) the fifth seed layer 242. The sixth seed layer 243 may, for example, be formed of a material that may be anisotropically etched (e.g., utilizing reactive ion (RIE) etching, etc.). Though the second set of seed layers 240 is shown in the example 200E comprising three layers, any integer number of layers may be formed.

In the example 200E, the TiW seed layer 241 may, for example, be formed to a thickness of 500 Angstroms, the Cu seed layer 242 may, for example, be formed to a thickness of 500 Angstroms, and the Ti (or parylene) layer 243 may be formed to a thickness of 500 Angstroms, but the scope of this disclosure is not limited to such example respective thicknesses. For example, the Ti or parylene layer 243 may be formed to a thickness in the range of 1000 Angstroms to 2000 Angstroms.

In general, block 130 may comprise forming a second set of one or more seed layers. Accordingly, the scope of the present disclosure should not be limited by characteristics of any particular manner of forming such seed layer(s) or by characteristics of any particular type of seed layer.

The example method 100 may, at block 135, comprise directionally etching, for example directionally etching at least one of the second set of one or more seed layers formed at block 130. Block 135 may comprise performing such directional (or anisotropic) etching in any of a variety of manners, non-limiting examples of which are provided herein.

Block 135 may, for example, comprise performing reactive ion etching to remove horizontal portions of the sixth seed layer 243 (e.g., titanium, parylene, etc.), leaving generally vertically oriented portions of the sixth seed layer 243.

Figure 2F:
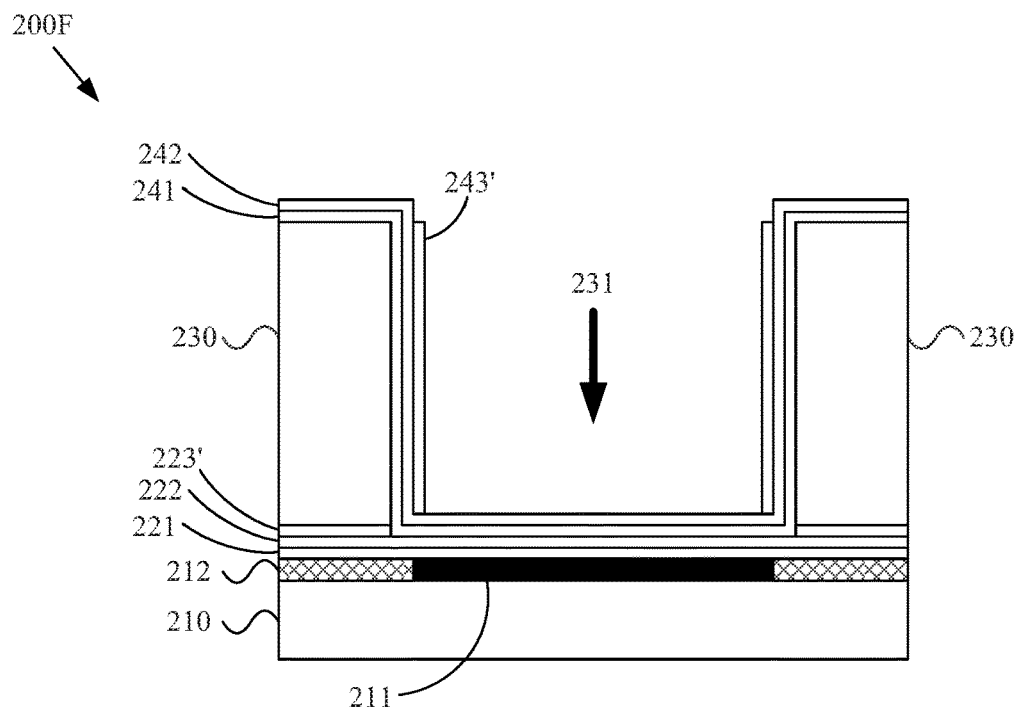

A non-limiting example 200F of the directional etching of block 135 is shown at FIG. 2F. Relative to the example 200E of FIG. 2E, the example 200F is shown with the horizontally oriented portions of the sixth seed layer 243 (e.g., horizontal portions on top of the pattern 230, horizontal portions at the bottom of the aperture 231 of the pattern 230, etc.) removed, leaving the vertically oriented portions of the sixth seed layer 243'. Such vertically oriented portions of the sixth seed layer 243' may, for example, protect underlying layers from etching in a later process step (e.g., at block 140, etc.).

In general, block 135 may comprise performing directional etching. Accordingly, the scope of the present disclosure should not be limited by characteristics of any particular manner of performing such directional etching or by characteristics of any particular type of directional etching.

The example method 100 may, at block 140, comprise etching, for example etching at least one of the second set of one or more seed layers formed at block 130. Block 140 may comprise performing such etching in any of a variety of manners, non-limiting examples of which are provided herein.

Block 140 may, for example, comprise performing a wet etching process to remove at least one of the second set of one or more seed layers. Block 140 may also, for example, comprise performing other types of etching (e.g., plasma etching or dry etching, anisotropic etching, etc.).

Figure 2G:
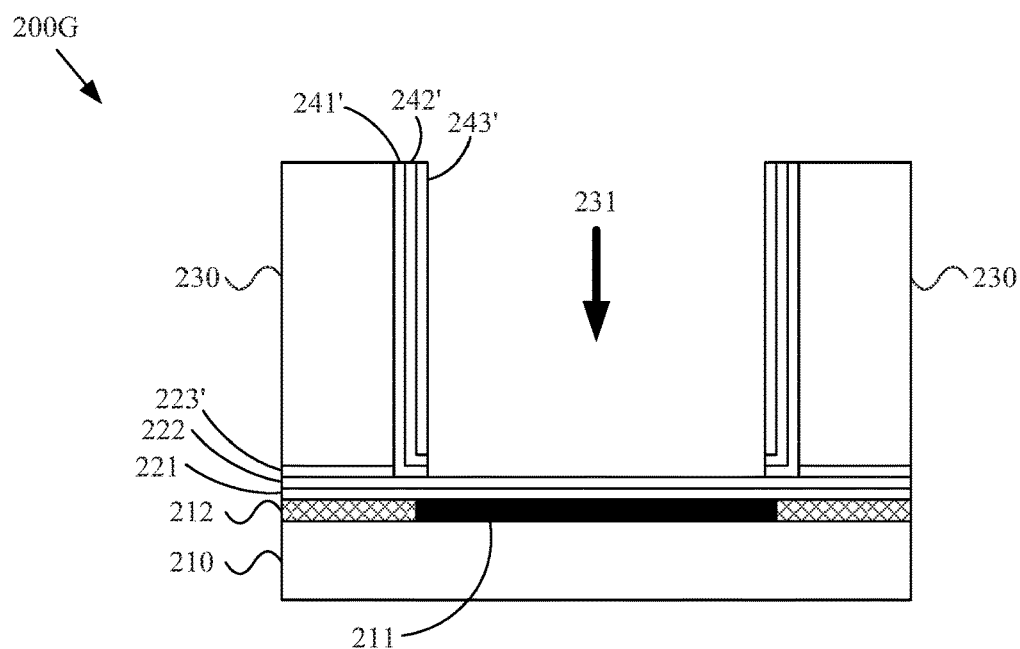
Figure 2H:
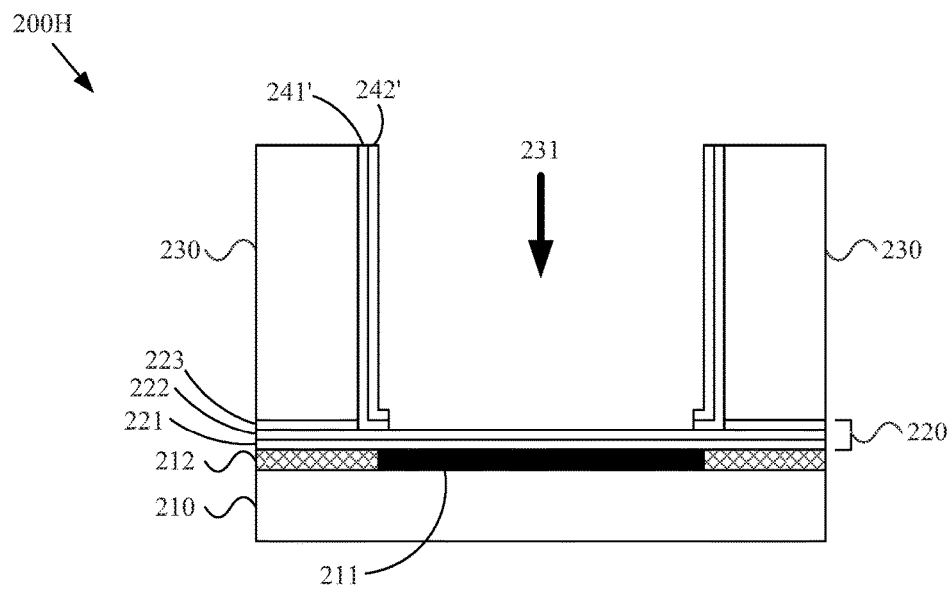

A non-limiting example 200G and 200H of the etching of block 140 is shown at FIGS. 2G and 2H. For example, horizontal portions of the fifth seed layer 242 (e.g., a Cu layer) and the fourth seed layer 241 (e.g., a TiW layer), which are exposed from the vertically oriented portion of the sixth seed layer 243', are etched away, leaving a vertically oriented portion of the fifth seed layer 242' remaining and a vertically oriented portion of the fourth seed layer 241'. As discussed herein such vertically oriented portions 241', 242', and 243' were formed on the interior surface(s) 233 of the aperture 231 of the pattern 230. For example, during the etching of the horizontally oriented portion of the fifth seed layer 242 and of the fourth seed layer 241, the vertically oriented portion of the sixth seed layer 243' (e.g., titanium, parylene, etc.) may protect the vertically oriented portions 241' and 242' of the fourth and fifth seed layers from such etching. As shown in FIG. 2G, the etching of the horizontal portions of the fifth seed layer 242 and the fourth seed layer 241 expose the top side of the pattern 230, and expose a horizontal portion of the second seed layer 222 (e.g., a copper seed layer, etc.) at the bottom of the aperture 231 in the pattern 230. Such exposed horizontal portion of the second seed layer 222 (e.g., a copper seed layer, etc.) may be utilized in a later plating operation (e.g., at block 145).

The vertically oriented portion of the sixth seed layer 243' may then be etched away, as shown in FIG. 2H relative to FIG. 2G. Such etching may, for example, be performed utilizing a wet etch (or other type of etching) that etches the vertically oriented portion of the sixth seed layer 243' (e.g., titanium, parylene, etc.), but does not etch the vertically oriented portion of the fifth seed layer 242' (e.g., copper, etc.). Such etching away of the vertically oriented portion of the sixth seed layer 243' may, for example, leave the vertically oriented portion of the fifth seed layer 242' (e.g., a copper seed layer, etc.) exposed for a later plating operation (e.g., at block 145).

Referring to FIG. 2H, the vertically oriented portion of the fifth seed layer 242' and the horizontal oriented portion of the second seed layer 222 that is exposed in the aperture 231 form a U-shaped cross-section (e.g., which might have a minor discontinuity from the remaining portion of the fourth seed layer 241'). In three dimensions, such seed layers 242' and 222 may form a cup-shape (e.g., a cylinder open at the top, a cuboid or cube that is open at the top, etc.).

In general, block 140 may comprise etching. Accordingly, the scope of the present disclosure should not be limited by characteristics of any particular manner of performing such etching or by characteristics of any particular type of etching.

The example method 100 may, at block 145, comprise performing a plating process, for example plating metal interconnection structures (e.g., pillars or posts, bumps, etc.). Block 145 may comprise performing the plating in any of a variety of manners, non-limiting examples of which are provided herein.

Block 145 may comprise performing an electroplating process to form a metal pillar in the aperture of the pattern, for example plating in a direction outward from the seed layers and into the aperture of the pattern. Note that the example metal pillars shown herein generally serve as electrical interconnection structures for an electronic component on which such metal pillars are formed. It should be understood however that such metal pillars need not provide electrical connections, but may for example provide a heat transfer function, a structural or mechanical function, etc.

The metal pillar may be cylinder-shaped, elliptical cylinder-shaped, rectangular post-shaped, etc. The conductive pillar may comprise a flat upper end, a concave upper end, or a convex upper end. The conductive pillar may, for example, comprise any of the materials discussed herein with regard to the seed layers. In an example implementation, the metal pillar may comprise copper (e.g., pure copper, copper with some impurities, etc.), a copper alloy, etc.). As discussed herein, the metal pillar may comprise a cavity that extends vertically through the center of the metal pillar for at least part of the total height of the metal pillar.

Figure 2I:
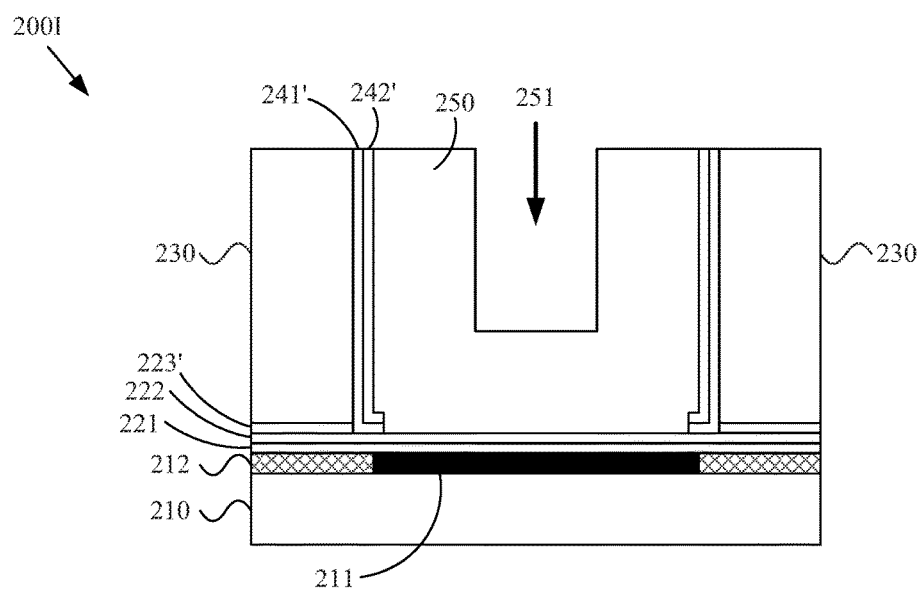

A non-limiting example 200I of the plating of block 145 is shown at FIG. 2I. As shown in the example 200I, block 145 may comprise forming the metal pillar 250 by, at least in part, plating in a lateral direction from the vertically oriented portion of the fifth seed layer 242'. For example, in an example configuration in which the aperture 231 in the pattern 230 is cylindrical-shaped (or cuboid-shaped, or cube-shaped, etc.), block 145 may comprise forming the metal pillar 250, at least in part, by plating in a direction radially inward from the vertically oriented portion of the fifth seed layer 242'. Block 145 may also, for example, comprise forming the metal pillar 250, at least in part, by plating in a direction vertically upward from the portion of the second seed layer 222 exposed at the bottom of the aperture 231.

Referring to FIG. 2I, the vertically oriented portion of the metal pillar 250 and the horizontal oriented portion of the metal pillar 250 form a U-shaped cross-section. In three dimensions, such seed layers 242' and 222 may form a cup-shape (e.g., a cylinder open at the top, a cuboid or cube that is open at the top, etc.). In an example implementation, the metal pillar 250 may comprise sides and a bottom that are from 10-30 microns thick (or from 20-50 microns thick). In an example implementation, the metal pillar 250 may have a height in a range of 200-250 microns tall and a width (or outer diameter) of about 200 microns. In an example implementation, the metal pillar 250 may comprise an interior cavity 251 that is about 100 microns. Note that the metal pillar 250 (or any pillar discussed herein) may be at least as tall as it is wide. Note also that the metal pillar 250 (or any pillar discussed herein) may be at least as tall as half of its width.

In an example implementation, the interior cavity 251 may have a height that is at least half or one fourth the height of the metal pillar 250. In an example implementation, the interior cavity 251 may have a height that is at least three fourths the height of the metal pillar 250. The interior cavity 251 may, for example, be cylindrical, cuboid-shaped, cube-shaped, etc. Note that in various example implementations, the plating may be performed to an extent that completely eliminates the cavity 251. Also, in various example implementations, the plating may be performed only in a lateral direction, leaving an interior cavity 251 (if not completely filled) that extends through the entire vertical height of the metal pillar 250.

In general, block 145 may comprise plating. Accordingly, the scope of the present disclosure should not be limited by characteristics of any particular manner of performing such plating or by characteristics of any particular type of plating or by characteristics of any particular type of plated metal pillar.

The example method 100 may, at block 150, comprise removing the pattern formed at block 120 (or a portion thereof). Block 150 may comprise performing such removing in any of a variety of manners, non-limiting examples of which are provided herein.

Block 150 may, for example, comprise utilizing chemical stripping, ashing, etc. to remove the pattern (or a portion thereof). Note that in various example implementations, at least a portion if not all of the pattern may remain in the completed electronic device, and block 150 may be skipped.

Figure 2J:
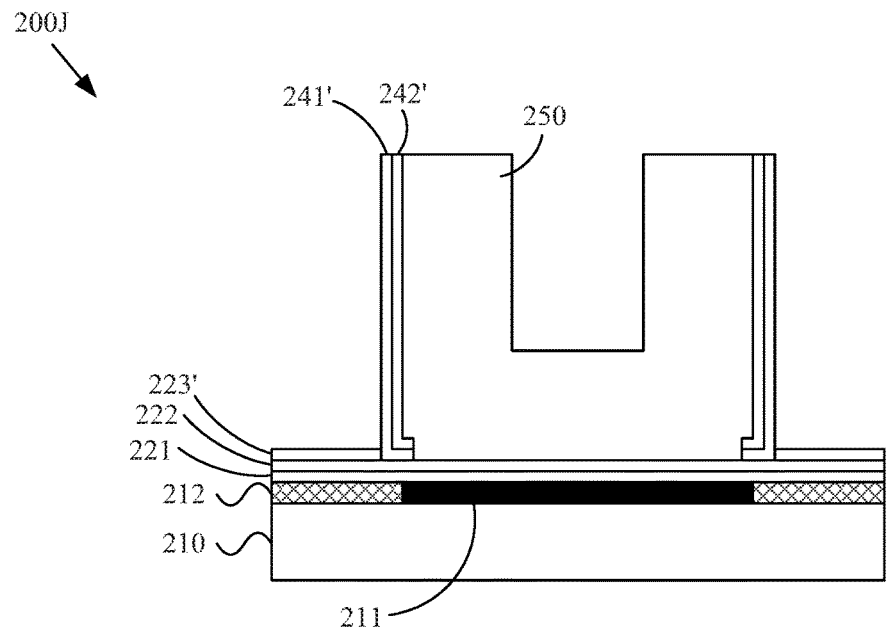

A non-limiting example 200J of the pattern removing of block 150 is shown at FIG. 2J, which relative to the example 200I of FIG. 2I, shows the pattern 230 removed.

In general, block 150 may comprise removing the pattern. Accordingly, the scope of the present disclosure should not be limited by characteristics of any particular manner of performing such removing or by characteristics of any particular type of removing.

The example method 100 may, at block 155, comprise etching, for example etching one or more seed layers (e.g., exposed by the removing of the pattern at block 150). Block 155 may comprise performing such etching in any of a variety of manners, non-limiting examples of which are provided herein.

Referring to FIG. 2J, Block 155 may, for example, comprise performing a wet etching process to remove the vertically oriented portion of the fourth seed layer 241' and the vertically oriented portion of the fifth seed layer 242'. Block 155 may also, for example, comprise performing a wet etching process to remove the portions of the third seed layer 223', second seed layer 222, and first seed layer 221 that are not covered by the metal pillar 250. Note that the etching of block 155 (or portions thereof) may etch some of the metal pillar 250, the extent of such etching is negligible relative to the dimensions of the metal pillar 250. For example, in an example implementation, a small etch (e.g., a half-micron etch) may be utilized to remove a copper seed layer, which is a relatively small amount of copper relative to a 30-micron thick copper wall of the metal pillar 250. Note also that block 155 may also, for example, comprise performing other types of etching (e.g., plasma etching or dry etching, anisotropic etching, etc.).

Figure 2K:
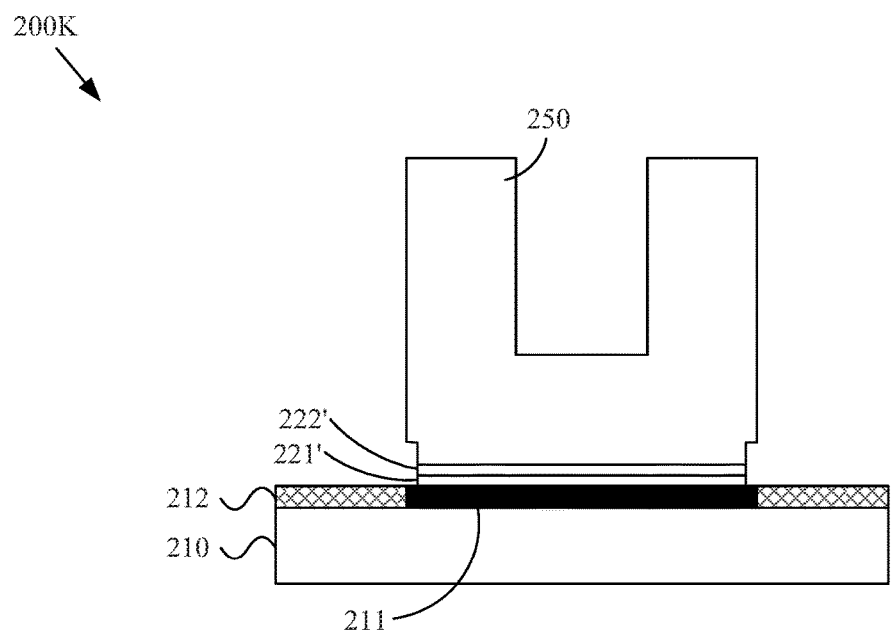

A non-limiting example 200K of the etching of block 155 is shown at FIG. 2K. For example, relative to the example 200J of FIG. 2J, the vertically oriented portion of the fourth seed layer 241' is removed, and the vertically oriented portion of the fifth seed layer 242' is removed. Additionally, the remaining portion of the third seed layer 223' is removed. Further, the portion of the second seed layer 222 that is not covered by the metal pillar 250 is removed, leaving a remaining portion of the second seed layer 222' under the metal pillar 250, and the portion of the first seed layer 221 that is not covered by the metal pillar 250 is removed, leaving a remaining portion of the first seed layer 221' under the metal pillar 250. The remaining portion of the second seed layer 222' and the remaining portion of the first seed layer 221' may also be referred to as under bump metallization (UBM) layers. Note that the removal of the portions of the first seed layer 221 and second seed layer 222 not covered by the metal pillar 250 serves to remove electrically conductive paths between the metal pillar 250 and other metal pillars formerly provided by such portions.

In general, block 155 may comprise etching. Accordingly, the scope of the present disclosure should not be limited by characteristics of any particular manner of performing such etching or by characteristics of any particular type of etching.

The example method 100 may, at block 160, comprise forming a dielectric layer. Block 160 may comprise forming the dielectric layer in any of a variety of manners, non-limiting examples of which are provided herein.

For example, in an example implementation, block 160 may comprise molding the dielectric layer utilizing any of a variety of types of molding (e.g., compression molding, transfer molding, liquid encapsulant molding, vacuum lamination, paste printing, film assisted molding, etc.) to surround the metal pillar and/or fill the cavity of the metal pillar.

Also for example, in an example implementation, block 160 may comprise forming the dielectric layer using any one or more of a variety of processes (e.g., spin coating, spray coating, printing, sintering, thermal oxidation, physical vapor deposition (PVD), chemical vapor deposition (CVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto.

The dielectric layer may comprise one or more layers of any of a variety of dielectric materials, for example inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto.

Figure 2L:
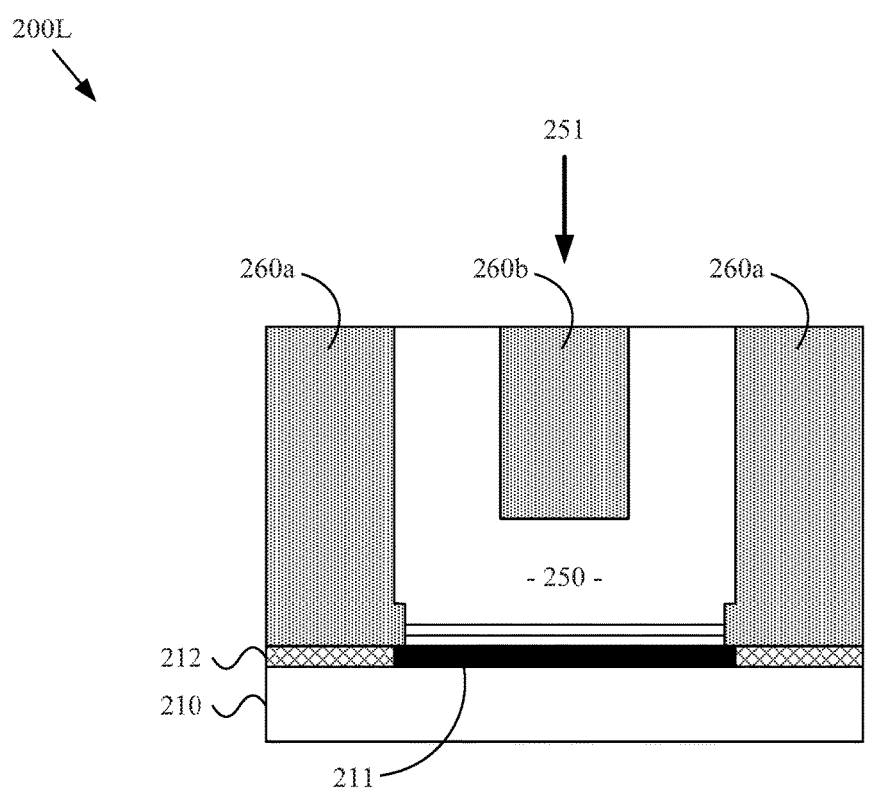

A non-limiting example 200L of the dielectric layer forming of block 160 is shown at FIG. 2L. The example 200L comprises first dielectric layer portion 260a that is formed between adjacent metal pillars 250. The example 200L also comprises a second dielectric layer portion 260b that fills the cavity 251 in the metal pillar 250.

Note that in an alternative implementation, block 160 may comprise filling the cavity 251 of the metal pillar 250 with a conductive material (e.g., solder, conductive epoxy or ink, etc.).

In general, block 160 may comprise forming a dielectric layer. Accordingly, the scope of the present disclosure should not be limited by characteristics of any particular manner of performing such dielectric layer or by characteristics of any particular type of dielectric layer.

The example method 100 may, at block 195, comprise preforming continued (or additional) processing on the semiconductor device. Such additional processing may comprise any of a variety of characteristics, non-limiting examples of which are provided herein.

For example, block 195 may comprise directing execution flow back to any prior block (or portion thereof) of the example method 100. Also for example, block 195 may comprise directing execution flow to any block (or portion thereof) of the example method 300 of FIG. 3.

Also for example, block 195 may comprise performing a planarizing process. Such planarizing may, for example, comprise mechanical grinding, chemical/mechanical planarization (CMP), etc. Referring to the example 200L of FIG. 2L, the top side of the dielectric layer 260a/260b and the top side of the metal pillar 250 may be planarized so that they are coplanar.

Also for example, block 195 may comprise forming a solder cap (or dome) on the interconnection structure (e.g., on the metal pillar 250). Additionally for example, block 195 may comprise performing a singulation operation, for example in an implementation in which the semiconductor die (or other electronic component) was received at block 110 in a wafer or panel form. Further for example, block 195 may comprise attaching interconnection structures (e.g., as formed at block 145) to a substrate or other electronic device. Still further for example, block 195 may comprise performing testing, marking, packaging, shipping, etc.

In general, block 195 may comprise performing continued processing. Accordingly, the scope of this disclosure should not be limited by characteristics of any particular type of additional processing.

The example implementations provided in FIGS. 1 and 2A-2L and discussed herein generally concerned an implementation in which an interconnection structure (e.g., metal pillar, etc.) was formed, at least in part, by plating in a radially inward direction to fill at least part of an aperture in a pattern. In another example implementation, an interconnection structure may be formed, at least in part, by plating in a radially outward direction from a post core. An example of such an implementation will now be presented.

Figure 3:
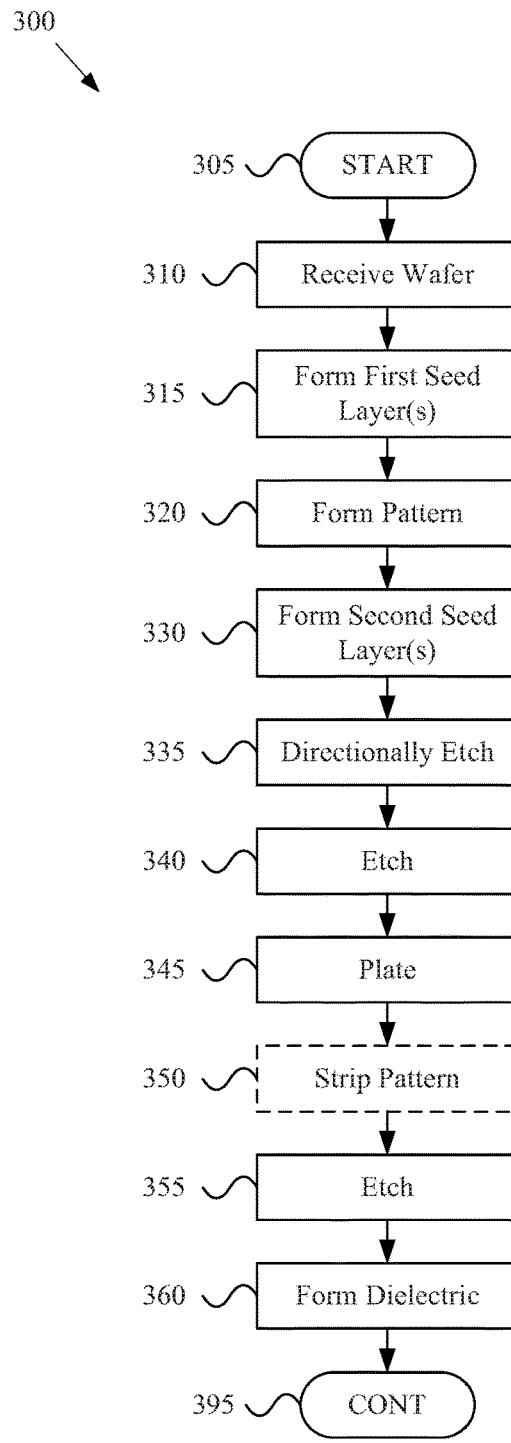
FIG. 3 shows a flow diagram of an example method of manufacturing a semiconductor device, in accordance with various aspects of the present disclosure.

FIG. 3 shows a flow diagram of an example method 100 of manufacturing a semiconductor device, in accordance with various aspects of the present disclosure. FIGS. 4A-4J show cross-sectional views of an example semiconductor device during manufacturing in accordance with the example method of FIG. 3. The following discussion will generally refer to FIG. 3 and FIGS. 4A-4J together. Note that the example method 300 may, for example, share any or all characteristics with the example method 100. Also note that the example methods and structures of FIGS. 4A-4J may share any or all characteristics with the example methods and structures of FIGS. 2A-2L.

The example method 300 may begin executing at block 305. The example method 300 may begin executing in response to any of a variety of conditions, non-limiting examples of which are provided herein. For example, the example method 300 may begin execution by receiving execution flow from any of the blocks 310-395 of the example method 300 or any portion of such blocks 310-395. Also for example, the example method 300 may begin execution by receiving execution flow from any of the blocks 110-195 of the example method 100 of FIG. 1 or any portion of such blocks 110-195.

The example method 100 may, at block 310, comprise receiving a semiconductor die (or a wafer or panel thereof). Block 310 may comprise receiving the semiconductor die or other electronic component (or wafer or panel thereof) in any of a variety of manners, non-limiting examples of which are provided herein.

Block 310 may, for example, comprise receiving a single semiconductor die (or electronic component). Also for example, block 310 may comprise receiving the semiconductor die as part of a wafer or panel of semiconductor dies. Block 310 may, for example, comprise receiving the semiconductor die from an upstream manufacturing station, from a testing station, from a shipping receiving station, from a cleaning station, etc.

The received semiconductor die (or other electronic component) may comprise any of a variety of characteristics.

Such semiconductor die may, for example, comprise a processor die, microprocessor, microcontroller, co-processor, general purpose processor, application-specific integrated circuit, programmable and/or discrete logic device, memory device, combination thereof, equivalent thereof, etc.

Note that although the examples provided herein generally concern a semiconductor die, the scope of the present disclosure is not limited thereto. For example block 310 may also, for example, comprise receiving one or more passive electronic devices (e.g., resistors, capacitors, inductors, etc.). Any or all of the operations discussed herein may be performed on one or more semiconductor die, on one or more passive electronic devices, on an interposer, any combination thereof, etc.

Figure 4A:
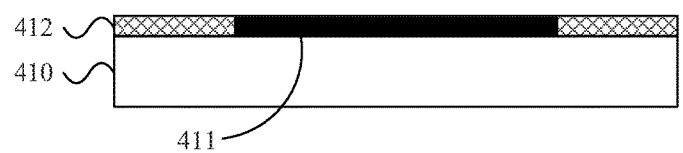
FIGS. 4A-4J show cross-sectional views of an example semiconductor device during manufacturing in accordance with the example method of FIG. 3.

A non-limiting example of the die receiving of block 310 is shown at FIG. 4A. The example semiconductor die 400A comprises a substrate 410 (e.g., a semiconductor substrate with electronic devices formed therein, etc.). The example semiconductor die 400A also comprises a bond pad 411 (e.g., through which electrical connection is provided to active circuitry of the die 400A). The bond pad 411 may comprise any of a variety of metals (e.g., copper, aluminum, gold, silver, etc.).

The example semiconductor die 400A also comprises a passivation (or dielectric) layer 412. The passivation layer 412 may, for example, cover the active circuitry of the semiconductor die 400A and provide electrical isolation between adjacent bond pads. Though the example passivation layer 412 is shown having a top surface that is generally coplanar with the top surface of the bond pad 411, the scope of this disclosure is not limited thereto. For example, the passivation layer 412 may cover a top periphery of the bond pad 411.

Note that although the present disclosure generally provides examples including a single bond pad and corresponding interconnection structure, the scope of the present disclosure is not limited thereto. For example, the semiconductor die may comprise any number of bond pads and interconnection structures. For example, any or all of the example illustrations shown and discussed herein may be laterally replicated in one or two dimensions to form an array or matrix or bond pads and interconnection structures.

Additionally, although the present disclosure generally provides examples including forming interconnection structures on semiconductor die bond pads, such structures may be formed on distribution layer traces, fan-in and/or fan-out traces, through-silicon vias, through mold vias, etc. Such forming of interconnection structures may thus, for example, be formed on an active side of a semiconductor die and/or on an inactive side of a semiconductor die.

In general, block 310 may comprise receiving a semiconductor die (or electronic component). Accordingly, the scope of the present disclosure should not be limited by characteristics of any particular manner of receiving a semiconductor die (or electronic component) or of any particular type of semiconductor die (or electronic component).

The example method 300 may, at block 315, comprise forming a first set of one or more seed layers on the semiconductor die (or wafer thereof). Block 315 may comprise forming the first set of one or more seed layers in any of a variety of manners, non-limiting examples of which are provided herein.

The first set of one or more seed layers may comprise any of a variety of materials. For example, the first set of one or more seed layers may comprise a first layer of titanium-tungsten (TiW), a second layer of copper (Cu), and a third layer of titanium-tungsten (TiW). Also for example, the first set of one or more seed layers may comprise one or more layers of any of a variety of metals (e.g., silver, gold, copper, aluminum, tungsten, titanium, nickel, molybdenum, etc.) or alloys thereof. Note that other materials (e.g., Parylene, etc.) may also be utilized.

Block 315 may comprise forming the first set of one or more seed layers utilizing any of a variety of techniques (e.g., sputtering or other physical vapor deposition (PVD) technique, chemical vapor deposition (CVD), atomic layer deposition (ALD), plasma vapor deposition, electroless plating, electrolytic plating, etc.). Block 315 may comprise forming each of the first set of one or more seed layers using a same process or utilizing different respective types of processes. The first set of one or more seed layers (or any portion thereof) may, for example, be utilized during a subsequent electroplating process (e.g., at block 345, etc.).

Figure 4B:
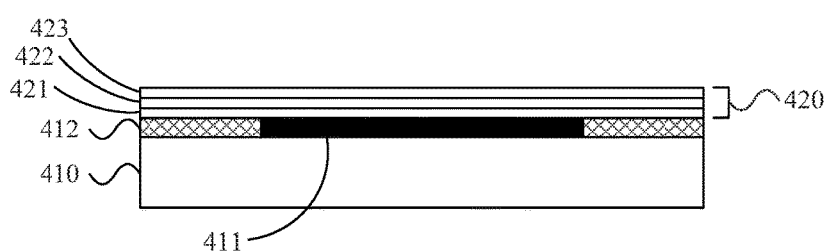

A non-limiting example 400B of the seed layer forming of block 315 is shown at FIG. 4B. In the example 400B, a first seed layer 421 (e.g., TiW or any of the metals discussed herein) is formed on the semiconductor die 400A (e.g., directly on the bond pad 411 and on the passivation layer 412). Then a second seed layer 422 (e.g., Cu or any of the metals discussed herein) is formed on (e.g., directly on, etc.) the first seed layer 421. Then a third seed layer 423 (e.g., TiW or any of the metals discussed herein) is formed on (e.g., directly on, etc.) the second seed layer 422. Though the first set of seed layers 420 is shown in the example 400B comprising three layers, any integer number of layers may be formed. In another example implementation, the third seed layer 423 may be omitted.

In the example 400B, each of the TiW seed layers 421 and 423 may, for example, be formed to a thickness of 1000 Angstroms, and the Cu seed layer 422 may, for example, be formed to a thickness of 2000 Angstroms, but the scope of this disclosure is not limited to such example respective thicknesses.

In general, block 315 may comprise forming a first set of one or more seed layers. Accordingly, the scope of the present disclosure should not be limited by characteristics of any particular manner of forming such seed layer(s) or by characteristics of any particular type of seed layer.

The example method 100 may, at block 320, comprise forming a pattern (or template or mask) on the first set of one or more seed layers formed at block 315. Block 320 may comprise forming the pattern in any of a variety of manners, non-limiting examples of which are provided herein.

For example, block 320 may comprise forming a pattern (or template or mask) over the first set of one or more seed layers to define a region (or volume) in which a metal pillar (or other interconnection structure) is to be formed. For example, the pattern may comprise a photoresist (PR) material, photopolymer material, general dielectric material, etc. The pattern may, for example, be formed utilizing a non-strippable resist (e.g., a photopolymer or the like that may be substantially more difficult to strip than a typical photoresist). The pattern may, for example, be patterned to form a pillar core around and/or on which a metal pillar (or other interconnection structure) is to be formed.

Figure 4C:
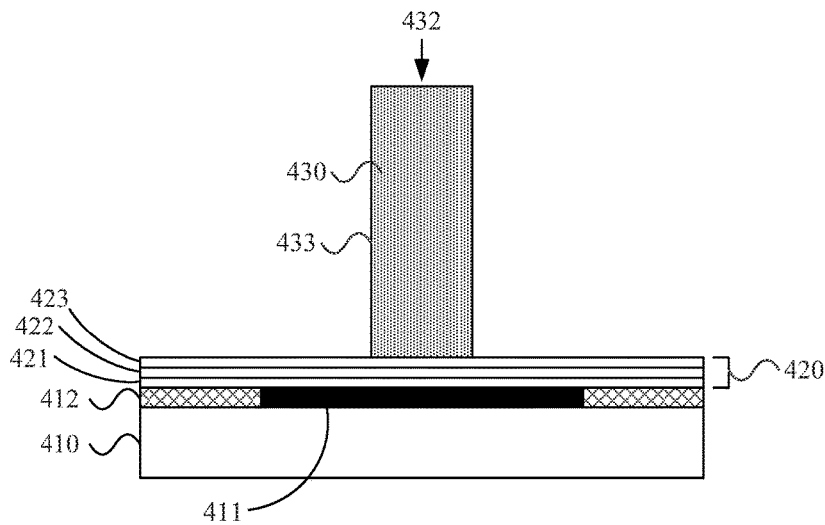

A non-limiting example 400C of the pattern forming of block 320 is shown at FIG. 4C. In the example 400C, a photoresist (PR) or photopolymer is patterned to include a pillar core 430 around and/or on which a metal pillar is to be formed (e.g., plated at block 345, etc.). The pillar core 430 may, for example, be bounded by one or more exterior core surface(s) 433. The exterior core surface(s) 433 may, for example, face generally laterally (or horizontally). The exterior core surface(s) 433 may, for example, be vertical, within 5% or 10% of vertical, etc.

The example pillar core 430 may also, for example, comprise a top core surface 432. The top core surface 432 may, for example, be generally planar and may, for example, be generally parallel to the top of the semiconductor die 400A and/or to the first set of one or more seed layers 420 (e.g., exactly parallel, within 5% or 10% of parallel, etc.).

The core 430 may, for example, comprise a cylindrical volume, cubical volume, etc. Note, however, that the core 430 may comprise any of a variety of different shapes. Block 320 may, for example, comprise forming the core 430 using a positive or negative photo process.

In general, block 320 may comprise forming a pattern. Accordingly, the scope of the present disclosure should not be limited by characteristics of any particular manner of forming such pattern or by characteristics of any particular type of pattern.

The example method 300 may, at block 330, comprise forming a second set of one or more seed layers. Block 330 may comprise forming the second set of one or more seed layers in any of a variety of manners, non-limiting examples of which are provided herein.

The second set of one or more seed layers may comprise any of a variety of materials. For example, the second set of one or more seed layers may comprise a first layer of titanium-tungsten (TiW), a second layer of copper (Cu), and a third layer of titanium (Ti) and/or parylene. Also for example, the second set of one or more seed layers may comprise one or more layers of any of a variety of metals (e.g., silver, gold, copper, aluminum, tungsten, titanium, parylene, nickel, molybdenum, etc.) or alloys thereof.

Block 330 may comprise forming the second set of one or more seed layers utilizing any of a variety of techniques (e.g., sputtering or other physical vapor deposition (PVD) technique, chemical vapor deposition (CVD), atomic layer deposition (ALD), plasma vapor deposition, electroless plating, electrolytic plating, etc.). Block 330 may comprise forming each of the second set of one or more seed layers using a same process or utilizing different respective types of processes. The second set of one or more seed layers (or any portion thereof) may, for example, be utilized during a subsequent electroplating process (e.g., at block 345, etc.).

Figure 4D:
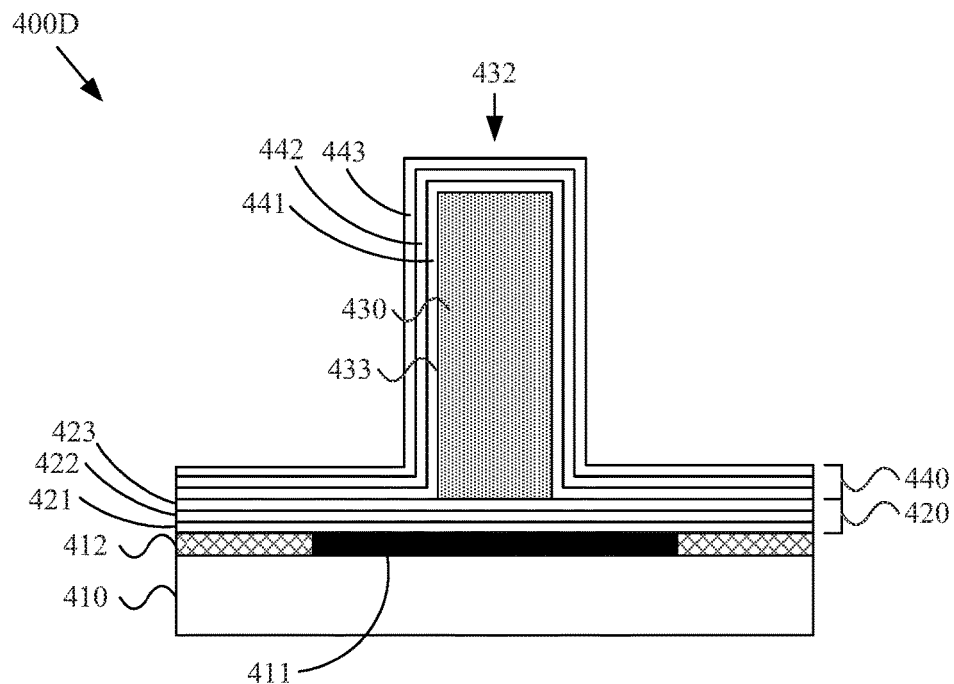

A non-limiting example 400D of the seed layer forming of block 330 is shown at FIG. 4D. In the example 400D, a fourth seed layer 441 (e.g., TiW or any of the metals discussed herein) is formed on the semiconductor die 400A (e.g., directly on the third seed layer 423 and on exterior core surface(s) 433 and top core surface 432 of the pattern 430). Then a fifth seed layer 442 (e.g., Cu or any of the metals discussed herein) is formed on (e.g., directly on, etc.) the fourth seed layer 441. Then a sixth seed layer 443 (e.g., Ti or parylene or any of the metals discussed herein) is formed on (e.g., directly on, etc.) the fifth seed layer 442. The sixth seed layer 443 may, for example, be formed of a material that may be anisotropically etched (e.g., utilizing reactive ion (RIE) etching, etc.). Though the second set of seed layers 440 is shown in the example 400D comprising three layers, any integer number of layers may be formed.

In the example 400D, the TiW seed layer 441 may, for example, be formed to a thickness of 500 Angstroms, the Cu seed layer 442 may, for example, be formed to a thickness of 500 Angstroms, and the Ti (or parylene) layer 443 may be formed to a thickness of 500 Angstroms, but the scope of this disclosure is not limited to such example respective thicknesses. For example, the Ti or parylene layer 443 may be formed to a thickness in the range of 1000 Angstroms to 2000 Angstroms.

In general, block 330 may comprise forming a second set of one or more seed layers. Accordingly, the scope of the present disclosure should not be limited by characteristics of any particular manner of forming such seed layer(s) or by characteristics of any particular type of seed layer.

The example method 300 may, at block 335, comprise directionally etching, for example directionally etching at least one of the second set of one or more seed layers formed at block 330. Block 335 may comprise performing such directional (or anisotropic) etching in any of a variety of manners, non-limiting examples of which are provided herein.

Block 335 may, for example, comprise performing reactive ion etching to remove horizontal portions of the sixth seed layer 443 (e.g., titanium, parylene, etc.), leaving generally vertically oriented portions of the sixth seed layer 443.

Figure 4E:
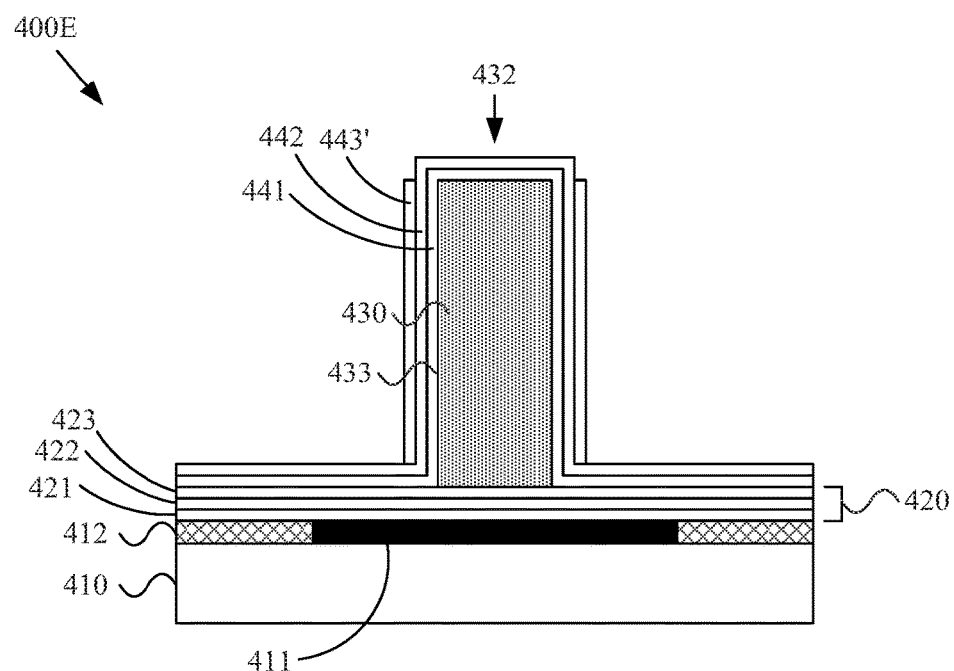

A non-limiting example 400E of the directional etching of block 335 is shown at FIG. 4E. Relative to the example 400D of FIG. 4D, the example 400E is shown with the horizontally oriented portions of the sixth seed layer 443 (e.g., horizontal portions on top of the pillar core 430, horizontal portions on top of the semiconductor die 400A, etc.) removed, leaving the vertically oriented portions of the sixth seed layer 443'. Such vertically oriented portions of the sixth seed layer 443' may, for example, protect underlying layers from etching in a later process step (e.g., at block 340, etc.).

In general, block 335 may comprise performing directional etching. Accordingly, the scope of the present disclosure should not be limited by characteristics of any particular manner of performing such directional etching or by characteristics of any particular type of directional etching.

The example method 300 may, at block 340, comprise etching, for example etching at least one of the second set of one or more seed layers formed at block 330. Block 340 may comprise performing such etching in any of a variety of manners, non-limiting examples of which are provided herein.

Block 340 may, for example, comprise performing a wet etching process to remove at least one of the second set of one or more seed layers. Block 340 may also, for example, comprise performing other types of etching (e.g., plasma etching or dry etching, anisotropic etching, etc.).

Figure 4F:
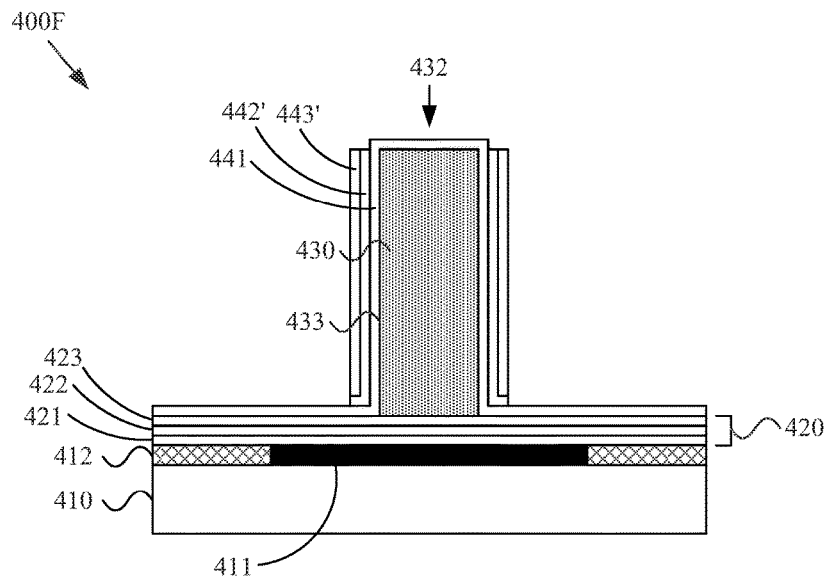
Figure 4G:
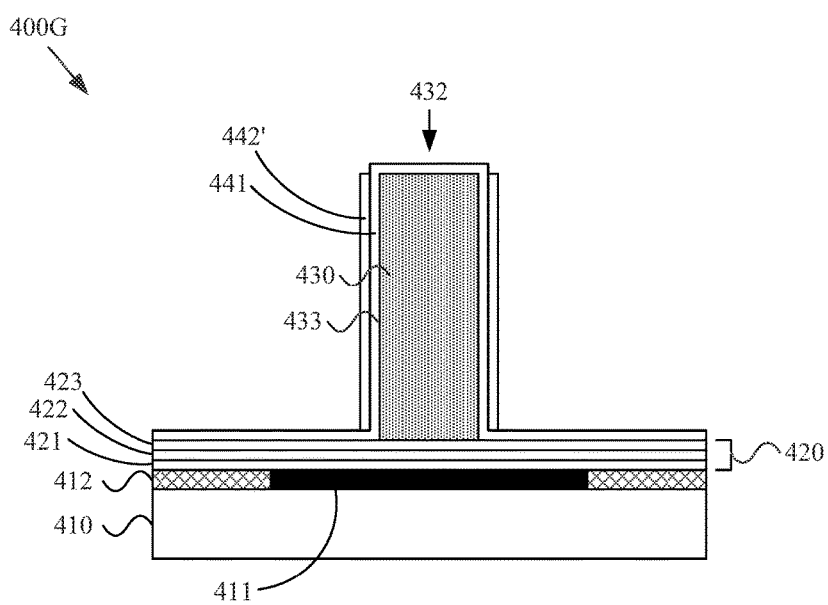

A non-limiting example 400F and 400G of the etching of block 340 is shown at FIGS. 4F and 4G. For example, horizontal portions of the fifth seed layer 442 (e.g., a Cu layer), which are exposed from the vertically oriented portion of the sixth seed layer 443', are etched away, leaving a vertically oriented portion of the fifth seed layer 442' remaining. Note that although not shown, the fourth seed layer 441 (e.g., a TiW layer) may similarly be etched. For example in an example scenario in which both the third seed layer 423 and the fourth seed layer 441 are formed of a same material (e.g., TiW, etc.), the fourth seed layer 441 may be etched away in a short etching process that is not long enough to also etch away the third seed layer 423 (or at least not all of the third seed layer 423). Also note that although not shown, at least some of the vertically oriented portion of the fifth seed layer 442' may be etched under cutting the vertically oriented portion of the sixth seed layer 443'. The extend of such etching may, for example be controlled by adjusting the thickness of the sixth seed layer 443, which may, for example, be substantially thicker (e.g., at least 1.5 times, at least 2.0 times, at least 10.0 times) than the fifth seed layer 442. As discussed herein such vertically oriented portions 442', and 443' were formed on the exterior surface(s) 433 of the patterned pillar core 430. For example, during the etching of the horizontally oriented portion of the fifth seed layer 442 (and of the fourth seed layer 441 if performed), the vertically oriented portion of the sixth seed layer 443' (e.g., titanium, parylene, etc.) may protect the vertically oriented portion 442' of the fifth seed layer 442 from such etching. As shown in FIG. 4F, the etching of the horizontal portions of the fifth seed layer 442 and the fourth seed layer 241 expose the top side of the fourth seed layer 441 at the top side 432 of the pillar core 430, and expose a horizontal portion of the fourth seed layer 441 (e.g., a TiW seed layer, etc.) on the semiconductor die 400A. Such exposed horizontal portion of the fourth seed layer 441 (e.g., a TiW seed layer, etc.) may be utilized in a later plating operation (e.g., at block 345) to inhibit plating in top of the pillar core 430 and/or on top of the semiconductor die 400A in regions where such plating is not desired.

The vertically oriented portion of the sixth seed layer 443' may then be etched away, as shown in FIG. 4G relative to FIG. 4F. Such etching may, for example, be performed utilizing a wet etch (or other type of etching) that etches the vertically oriented portion of the sixth seed layer 443' (e.g., titanium, parylene, etc.), but does not etch the vertically oriented portion of the fifth seed layer 442' (e.g., copper, etc.). Such etching away of the vertically oriented portion of the sixth seed layer 443' may, for example, leave the vertically oriented portion of the fifth seed layer 442' (e.g., a copper seed layer, etc.) exposed for a later plating operation (e.g., at block 345).

Referring to FIG. 4G, the vertically oriented portion of the fifth seed layer 442' forms a perimeter surface (e.g., of copper, etc.) around the pillar core 430. The fifth seed layer 442' may thus take the form of a tube laterally surrounding the pillar core 430. The fourth seed layer 441 (and/or the third seed layer 423), which may for example be formed of TiW, may cover the remainder of the example 400G (e.g., the top surface 432 of the pillar core 430 and the top of the remainder of the semiconductor die 400A) to inhibit plating. Note that other materials that inhibit plating (e.g., copper plating, etc.) may be utilized.

In general, block 340 may comprise etching. Accordingly, the scope of the present disclosure should not be limited by characteristics of any particular manner of performing such etching or by characteristics of any particular type of etching.

The example method 300 may, at block 345, comprise performing a plating process, for example plating metal interconnection structures (e.g., pillars or posts, bumps, etc.). Block 345 may comprise performing the plating in any of a variety of manners, non-limiting examples of which are provided herein.

Block 345 may comprise performing an electroplating process to form a metal pillar around the patterned pillar core, for example plating in a direction outward from the seed layers and radially outward from the pillar core. Note that the example metal pillars shown herein generally serve as electrical interconnection structures for an electronic component on which such metal pillars are formed. It should be understood however that such metal pillars need not provide electrical connections, but may for example provide a heat transfer function, a structural or mechanical function, etc.

The metal pillar may be cylinder-shaped, elliptical cylinder-shaped, rectangular post-shaped, etc. The conductive pillar may comprise a flat upper end, a concave upper end, or a convex upper end. The conductive pillar may, for example, comprise any of the materials discussed herein with regard to the seed layers. In an example implementation, the metal pillar may comprise copper (e.g., pure copper, copper with some impurities, etc.), a copper alloy, etc.). As discussed herein, the metal pillar may comprise a cavity that is filled with the patterned pillar core and that extends vertically through the center of the metal pillar for the entire height of the metal pillar (or at least part of the total height of the metal pillar).

Figure 4H:
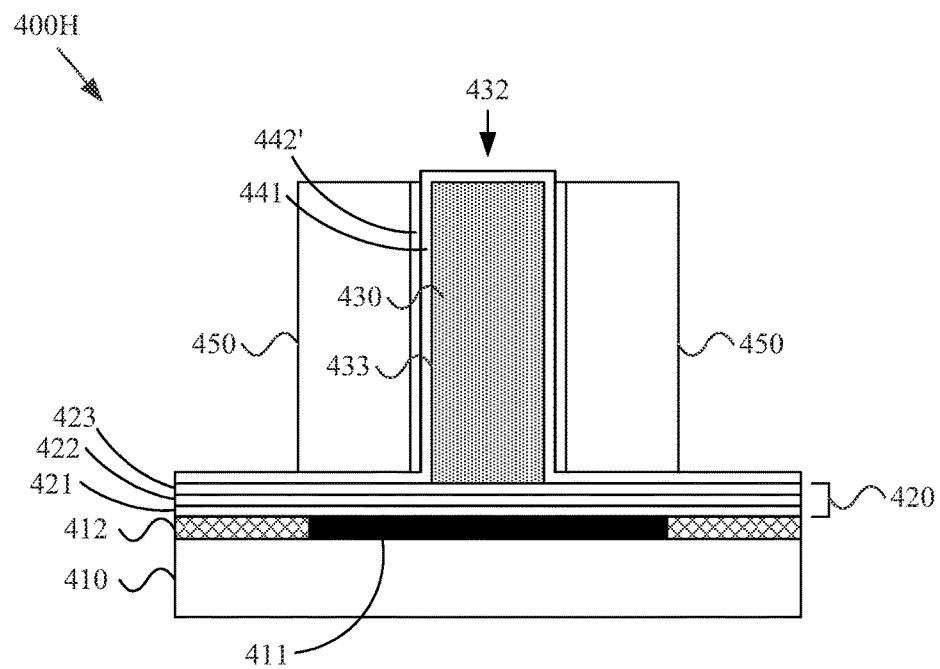

A non-limiting example 400H of the plating of block 345 is shown at FIG. 4H. As shown in the example 400H, block 345 may comprise forming the metal pillar 450 by, at least in part, plating in a lateral direction from the vertically oriented portion of the fifth seed layer 442'. For example, in an example configuration in which the patterned pillar core 230 is cylindrical-shaped (or cuboid-shaped, or cube-shaped, etc.), block 345 may comprise forming the metal pillar 450, at least in part, by plating in a direction radially outward from the vertically oriented portion of the fifth seed layer 442'.

Referring to FIG. 4H, the vertically oriented portion of the metal pillar 450 may form a tube-shape (e.g., a cylinder open at the top and bottom, a cuboid or cube that is open at the top and bottom, etc.). In an example implementation, the metal pillar 450 may comprise a side (or sides) that are from 10-30 microns thick (or from 20-50 microns thick). In an example implementation, the metal pillar 450 may have a height in a range of 200-250 microns tall and a width (or outer diameter) of about 200 microns. In an example implementation, the metal pillar 450 may comprise an interior cavity that is about 100 microns and filled with the pillar core 430. Note that in various example alternative implementations, the pillar core 430 may be removed and/or filled with any of the other materials discussed herein. Note that the metal pillar 450 (or any pillar discussed herein) may be at least as tall as it is wide. Note also that the metal pillar 450 (or any pillar discussed herein) may be at least as tall as half of its width.

In an example implementation, the pillar core 430 may have a height that is at least as tall as the metal pillar 450 (or at least half the height of the metal pillar 450). In an example implementation, the pillar core 430 may have a height that is greater than the height of the metal pillar 450. The interior cavity of the metal pillar 450 (whether filled with the pillar core 430 or not) may, for example, be cylindrical, cuboid-shaped, cube-shaped, etc.

In general, block 345 may comprise plating. Accordingly, the scope of the present disclosure should not be limited by characteristics of any particular manner of performing such plating or by characteristics of any particular type of plating or by characteristics of any particular type of plated metal pillar.

The example method 100 may, at block 350, comprise removing the pattern formed at block 320 (or a portion thereof). Block 350 may comprise performing such removing in any of a variety of manners, non-limiting examples of which are provided herein. Note that block 350 may be skipped in an example implementation in which the pillar core, on which the metal pillar is formed, remains part of the completed electronic device. Block 350 may, for example, comprise utilizing chemical stripping, ashing, etc. to remove the pattern (or a portion thereof).

In general, block 350 may comprise removing the pattern (or any portion thereof). Accordingly, the scope of the present disclosure should not be limited by characteristics of any particular manner of performing such removing or by characteristics of any particular type of removing.

The example method 300 may, at block 355, comprise etching, for example etching one or more seed layers (e.g., still exposed after the plating). Block 355 may comprise performing such etching in any of a variety of manners, non-limiting examples of which are provided herein.

Figure 4I:
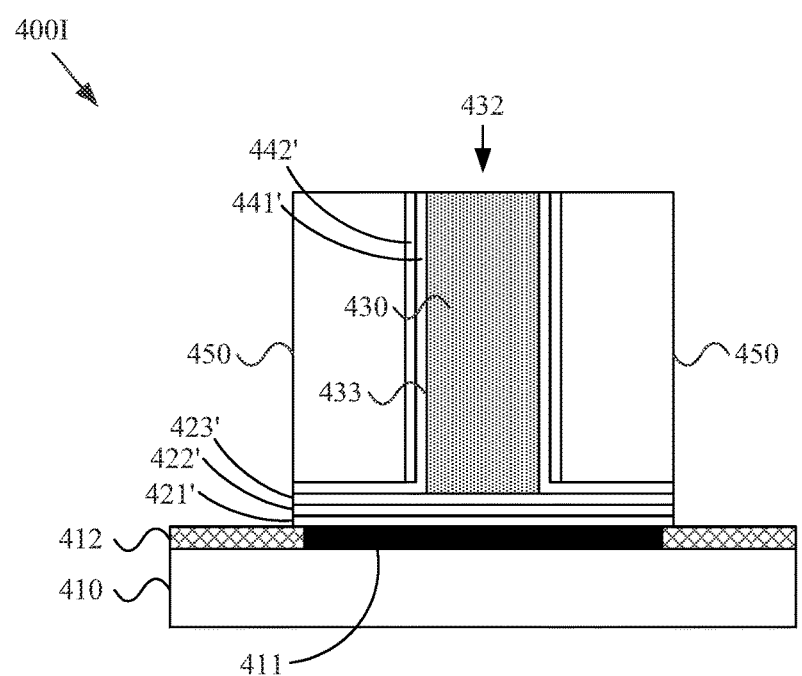

Referring to FIG. 4I, Block 355 may, for example, comprise performing a wet etching process to remove the portions of the first seed layer 421, second seed layer 422, third seed layer 423, and fourth seed layer 441 that are exposed from (or not covered by) the plated metal pillar 450 (or interconnection structure) or the pillar core 430. Note that the etching of block 355 (or portions thereof) may etch some of the metal pillar 450, but the extent of such etching is negligible relative to the dimensions of the metal pillar 450. For example, in an example implementation, a small etch (e.g., a half-micron etch) may be utilized to remove a copper seed layer, which is a relatively small amount of copper relative to a 30-micron thick copper wall of the metal pillar 450. Note also that block 355 may also, for example, comprise performing other types of etching (e.g., plasma etching or dry etching, anisotropic etching, etc.).

A non-limiting example 400I of the etching of block 355 is shown at FIG. 4I. For example, relative to the example 400H of FIG. 4H, the horizontal portions of the fourth seed layer 441 (e.g., on top of the pillar core 430 and on top of the third seed layer 423), which are not covered by the pillar 450 are removed. Further, the portion of the third seed layer 423 that is not covered by the metal pillar 450 or by the pillar core 430 is removed, leaving a remaining portion of the third seed layer 423' under the metal pillar 450 and under the pillar core 430, the portion of the second seed layer 422 that is not covered by the metal pillar 450 or by the pillar core 430 is removed, leaving a remaining portion of the second seed layer 422' under the metal pillar 450 and under the pillar core 430, and the portion of the first seed layer 421 that is not covered by the metal pillar 450 or by the pillar core 430 is removed, leaving a remaining portion of the first seed layer 421' under the metal pillar 450 and under the pillar core 430. The remaining portion of the fourth seed layer 441', remaining portion of the third seed layer 423', remaining portion of the second seed layer 422', and remaining portion of the first seed layer 421' may also be referred to as under bump metallization (UBM) layers. Note that the removal of the portions of the fourth seed layer 441, third seed layer 423, second seed layer 422 and first seed layer 421 not covered by the metal pillar 450 or by the pillar core 430 serves to remove electrically conductive paths between the metal pillar 450 and other metal pillars formerly provided by such portions.

In general, block 355 may comprise etching. Accordingly, the scope of the present disclosure should not be limited by characteristics of any particular manner of performing such etching or by characteristics of any particular type of etching.

The example method 300 may, at block 360, comprise forming a dielectric layer. Block 360 may comprise forming the dielectric layer in any of a variety of manners, non-limiting examples of which are provided herein.

For example, in an example implementation, block 360 may comprise molding the dielectric layer utilizing any of a variety of types of molding (e.g., compression molding, transfer molding, liquid encapsulant molding, vacuum lamination, paste printing, film assisted molding, etc.) to surround the metal pillar and/or fill the cavity of the metal pillar.

Also for example, in an example implementation, block 360 may comprise forming the dielectric layer using any one or more of a variety of processes (e.g., spin coating, spray coating, printing, sintering, thermal oxidation, physical vapor deposition (PVD), chemical vapor deposition (CVD), metal organic chemical vapor deposition (MOCVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto.

The dielectric layer may comprise one or more layers of any of a variety of dielectric materials, for example inorganic dielectric material (e.g., $Si_3N_4$, $SiO_2$, SiON, SiN, oxides, nitrides, combinations thereof, equivalents thereof, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto.

Figure 4J:
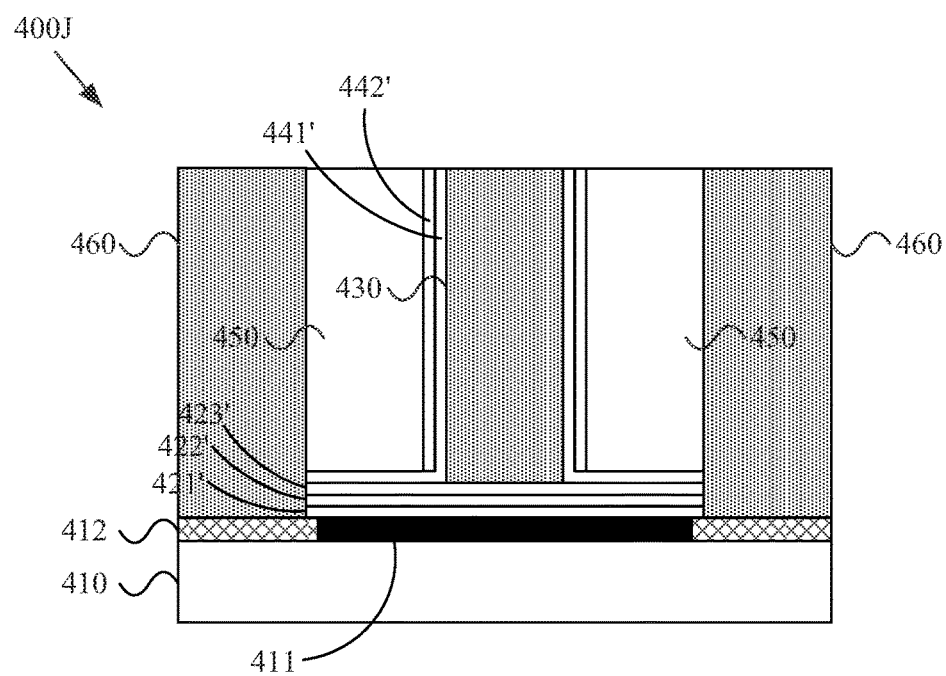

A non-limiting example 400J of the dielectric layer forming of block 360 is shown at FIG. 4J. The example 400J comprises a dielectric layer 460 that is formed between adjacent metal pillars 450. The example 400J also shows that the patterned pillar core 430, around which the metal pillar 450 was form, remains in place, thus filling a cavity in the metal pillar 450.

Note that in an alternative implementation, block 360 may comprise filling the cavity of the metal pillar 450 (formerly occupied by the pillar core 430) with a conductive material (e.g., solder, conductive epoxy or ink, etc.).

In general, block 360 may comprise forming a dielectric layer. Accordingly, the scope of the present disclosure should not be limited by characteristics of any particular manner of performing such dielectric layer or by characteristics of any particular type of dielectric layer.

The example method 300 may, at block 395, comprise preforming continued (or additional) processing on the semiconductor device. Such additional processing may comprise any of a variety of characteristics, non-limiting examples of which are provided herein.

For example, block 395 may comprise directing execution flow back to any prior block (or portion thereof) of the example method 300. Also for example, block 395 may comprise directing execution flow to any block (or portion thereof) of the example method 100 of FIG. 1.

Also for example, block 395 may comprise performing a planarizing process. Such planarizing may, for example, comprise mechanical grinding, chemical/mechanical planarization (CMP), etc. Referring to the example 400J of FIG. 4J, the top side of the dielectric layer 460, top side of the pillar core 430, and the top side of the metal pillar 450 may be planarized so that they are coplanar.

Also for example, block 395 may comprise forming a solder cap (or dome) on the interconnection structure (e.g., on the metal pillar 450). Additionally for example, block 395 may comprise performing a singulation operation, for example in an implementation in which the semiconductor die was received at block 310 in a wafer or panel form. Further for example, block 395 may comprise attaching interconnection structures (e.g., as formed at block 345) to a substrate or other electronic device. Still further for example, block 395 may comprise performing testing, marking, packaging, shipping, etc.

In general, block 395 may comprise performing continued processing. Accordingly, the scope of this disclosure should not be limited by characteristics of any particular type of additional processing.

In summary, various aspects of this disclosure provide a semiconductor device and a method of manufacturing a semiconductor device. As a non-limiting example, various aspects of this disclosure provide a method of manufacturing a semiconductor device comprising forming interconnection structures by at least part performing a lateral plating process, and a semiconductor device manufactured thereby. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. An electronic device comprising:
    a bond pad; and
    a conductive pillar on the bond pad, the conductive pillar comprising:
        an inner pillar core comprising a top core surface, a bottom core surface, and a lateral core surface between the top core surface and the bottom core surface;
        a seed layer that laterally surrounds the inner pillar core; and
        an outer plated metal that laterally surrounds the seed layer,
        wherein at least a portion of the top core surface is exposed from the seed layer.

2. The electronic device of claim 1, wherein the entire top core surface is exposed from the seed layer.

3. The electronic device of claim 1, comprising a second seed layer positioned laterally between the seed layer and the outer plated metal.

4. The electronic device of claim 3, wherein at least a portion of the top core surface is exposed from the second seed layer.

5. The electronic device of claim 1, wherein at least a portion of the top core surface is exposed from the outer plated metal.

6. The electronic device of claim 1, wherein the inner pillar core is vertically longer than the outer plated metal.

7. An electronic device comprising:
    a bond pad; and
    a conductive pillar on the bond pad, the conductive pillar comprising:
        an inner pillar core comprising a top core surface, a bottom core surface, and a lateral core surface between the top core surface and the bottom core surface;
        a seed layer that laterally surrounds the inner pillar core; and
        an outer plated metal that laterally surrounds the seed layer,
        wherein a top surface of the outer plated metal is coplanar with the top core surface.

8. The electronic device of claim 7, wherein a top surface of the seed layer is coplanar with the top core surface.

9. The electronic device of claim 7, comprising a second seed layer positioned laterally between the seed layer and the outer plated metal, wherein a top surface of the second seed layer is coplanar with the top core surface.

10. The electronic device of claim 7, comprising a dielectric layer that laterally surrounds the conductive pillar.

11. The electronic device of claim 10, wherein a top surface of the dielectric layer is coplanar with the top core surface.

12. The electronic device of claim 10, comprising a base seed layer on which the inner pillar core is plated, and wherein the dielectric layer laterally surrounds the base seed layer.

13. The electronic device of claim 7, wherein the bottom core surface is vertically lower than a bottom surface of the outer plated metal.

14. The electronic device of claim 7, wherein respective ends of at least four seed layers are exposed at a lateral side of the conductive pillar.

15. An electronic device comprising:
    a bond pad; and
    a conductive pillar on the bond pad, the conductive pillar comprising:
        a base seed layer;
        an inner pillar core plated on the base seed layer, the inner pillar core comprising a top core surface, a bottom core surface, and a lateral core surface between the top core surface and the bottom core surface;
        at least one horizontal seed layer on base seed layer and laterally surrounding a bottom end of the inner pillar core;
        at least two vertical seed layers laterally surrounding the inner pillar core; and
        an outer plated metal that laterally surrounds the at least two vertical seed layers,
        wherein the at least two vertical seed layers outnumber the at least one horizontal seed layer.

16. The electronic device of claim 15, comprising a dielectric layer that laterally surrounds the at least one horizontal seed layer.

17. The electronic device of claim 16, wherein the dielectric layer laterally surrounds the base seed layer.

18. The electronic device of claim 16, wherein the dielectric layer laterally surrounds the entire at least two vertical seed layers.

19. The electronic device of claim 15, wherein a first horizontal seed layer of the at least one horizontal seed layer and a first vertical seed layer of the at least two vertical seed layers are portions of a same continuous layer of metal.

20. The electronic device of claim 15, wherein the conductive pillar comprises more seed layers directly vertically between the inner pillar core and the bond pad than vertical seed layers laterally surrounding the inner pillar core.

* * * * *